United States Patent
Grede et al.

(10) Patent No.: US 10,551,867 B2
(45) Date of Patent: Feb. 4, 2020

(54) GENERATING A PLURALITY OF CLOCK SIGNALS OR HIGH-FREQUENCY SIGNALS

(71) Applicant: TRUMPF Huettinger GmbH + Co. KG, Freiburg (DE)

(72) Inventors: Andre Grede, Freiburg (DE); Daniel Gruner, Muellheim (DE); Armin Bannwarth, Waldkirch (DE); Christian Bock, Freiburg (DE); Christoph Hofstetter, Teningen (DE); Alberto Pena Vidal, Freiburg (DE); Nikolai Schwerg, Genève (CH); Manuel vor dem Brocke, Freiburg (DE); Markus Winterhalter, Bad Krozingen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/858,312

(22) Filed: Dec. 29, 2017

(65) Prior Publication Data
US 2018/0120889 A1 May 3, 2018

Related U.S. Application Data

(63) Continuation of application No. PCT/EP2016/065386, filed on Jun. 30, 2016.

(30) Foreign Application Priority Data

Jun. 30, 2015 (DE) .......................... 10 2015 212 243

(51) Int. Cl.
*G06F 1/02* (2006.01)
*G06F 1/025* (2006.01)
(Continued)

(52) U.S. Cl.
CPC .............. *G06F 1/022* (2013.01); *G06F 1/025* (2013.01); *H01J 37/32174* (2013.01); *H03K 3/01* (2013.01); *H03K 2005/00267* (2013.01)

(58) Field of Classification Search
None
See application file for complete search history.

(56) References Cited

U.S. PATENT DOCUMENTS 5,635,875 A * 6/1997 Kusakabe ................. H03L 7/10
327/156
5,824,606 A 10/1998 Dible et al.
(Continued)

FOREIGN PATENT DOCUMENTS

DE 19751269 11/1998
DE 10 2013 226 537 6/2015
(Continued)

OTHER PUBLICATIONS

International Search Report and Written Opinion in International Application No. PCT/EP2016/065386, dated Feb. 23, 2017, 34 pages (with English translation).

*Primary Examiner* — Cassandra F Cox
(74) *Attorney, Agent, or Firm* — Fish & Richardson P.C.

(57) ABSTRACT

The invention relates to a device for generating a plurality of clock signals or high-frequency signals. The devices includes a reference signal generator, which is connected to an oscillator and generates at its output a reference signal with a reference frequency fx. The device also includes at least one signal processor, for example, a DDS, which is connected to the reference frequency generator via a first signal line and to which the reference signal with the reference frequency fx is supplied, and which is configured to generate an output signal having a frequency less than fx.

19 Claims, 1 Drawing Sheet

(51) Int. Cl.
   *H01J 37/32*   (2006.01)
   *H03K 3/01*    (2006.01)
   *H03K 5/00*    (2006.01)

(56) References Cited

U.S. PATENT DOCUMENTS

| | | | |
|---|---|---|---|
| 5,932,116 | A | 8/1999 | Matsumoto et al. |
| 6,184,733 | B1 | 2/2001 | Wang et al. |
| 6,429,796 | B1 | 8/2002 | Buckley |
| 6,884,635 | B2 | 4/2005 | Parsons |
| 7,624,296 | B2 | 11/2009 | Peters |
| 8,692,467 | B2 | 4/2014 | Benjamin et al. |
| 2002/0051503 | A1* | 5/2002 | Takahiko ............... H03D 3/007 375/327 |
| 2003/0095068 | A1 | 5/2003 | Purdy et al. |
| 2005/0177758 | A1 | 8/2005 | Stickle |
| 2005/0271131 | A1* | 12/2005 | Hafed .............. G01R 31/31709 375/224 |
| 2006/0014515 | A1* | 1/2006 | Ruelke ................. H03D 7/1441 455/326 |
| 2007/0044715 | A1 | 3/2007 | Blattner et al. |
| 2008/0284472 | A1* | 11/2008 | Han ....................... H03B 29/00 327/113 |
| 2009/0167375 | A1 | 7/2009 | Miki et al. |
| 2011/0141975 | A1* | 6/2011 | Herzog ................. H04H 20/67 370/328 |
| 2014/0240004 | A1 | 8/2014 | Fawley et al. |
| 2014/0263199 | A1 | 9/2014 | Nelson et al. |
| 2016/0300695 | A1 | 10/2016 | Alt et al. |

FOREIGN PATENT DOCUMENTS

| | | |
|---|---|---|
| EP | 0831679 | 3/1998 |
| EP | 0890296 | 1/1999 |
| EP | 1753011 | 2/2007 |
| WO | WO 9737518 | 10/1997 |
| WO | WO 2014/094738 | 6/2014 |
| WO | WO 2017/001603 | 1/2017 |

* cited by examiner

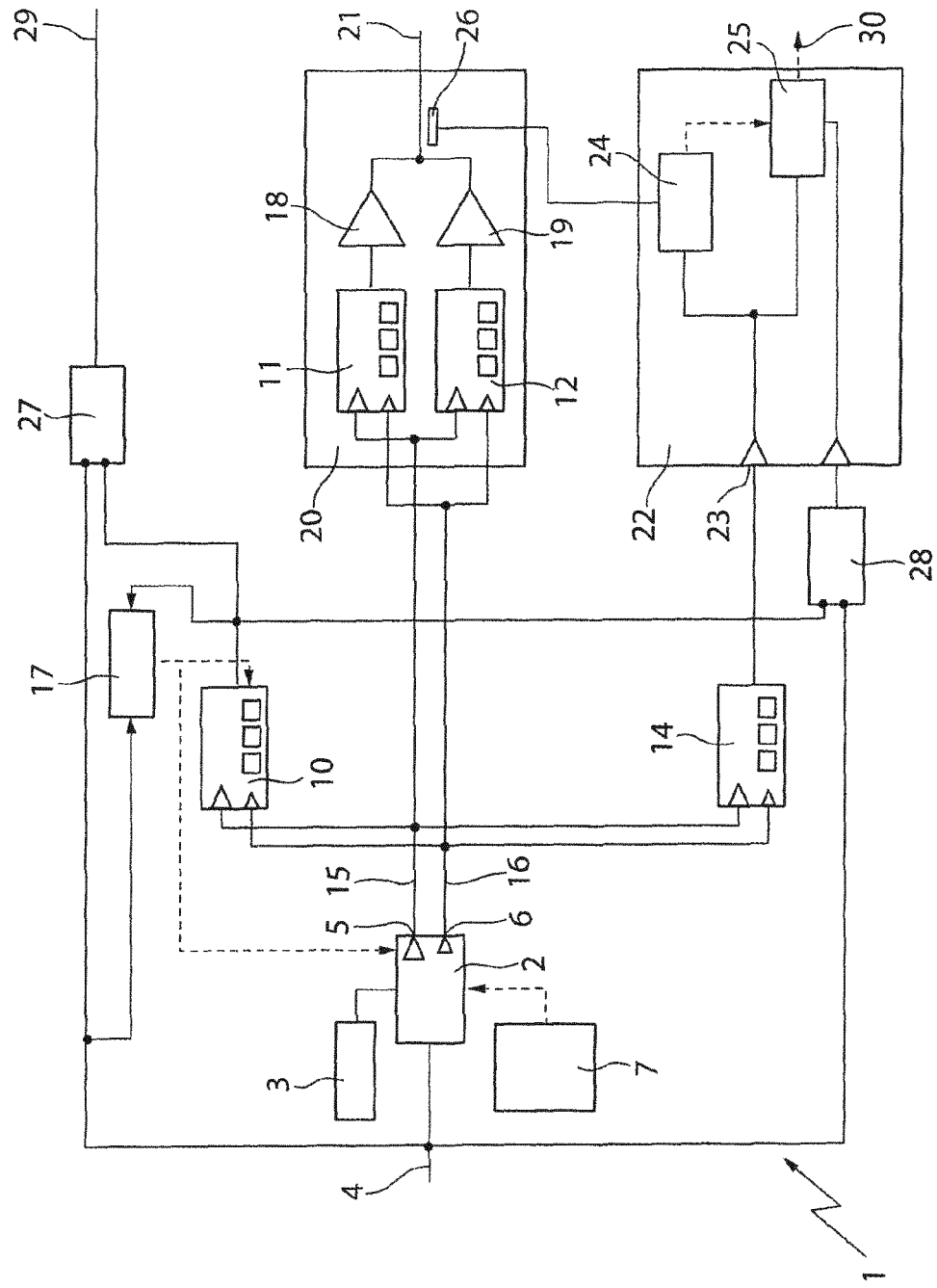

GENERATING A PLURALITY OF CLOCK SIGNALS OR HIGH-FREQUENCY SIGNALS

CROSS REFERENCE TO RELATED APPLICATIONS

This application is a continuation of and claims priority under 35 U.S.C. § 120 from PCT Application No. PCT/EP2016/065386 filed on Jun. 30, 2016, which claims priority from German Application No. DE 10 2015 212 243.3, filed on Jun. 30, 2015. The entire contents of each of these priority applications are incorporated herein by reference.

TECHNICAL FIELD

The invention relates to an apparatus for generating a plurality of clock signals or high-frequency signals. The invention further relates to a method for generating a plurality of clock signals or high-frequency signals.

BACKGROUND

Similar apparatuses and methods of this kind are known e.g. from the following documents: U.S. Pat. No. 7,624,296 B2, DE 10 2013 226 537 A1, US 2005/0177758 A1, US 2003/0095068 A1, US 20140/0263199 A1, U.S. Pat. No. 6,884,635 B2, U.S. Pat. No. 8,692,467 B2, U.S. Pat. Nos. 5,932,116 A, 5,824,606 A.

In high-frequency applications, for example, in the generation of high-frequency power for carrying out a plasma process, there are certain requirements. The jitter between the high-frequency output power signal and a sampling rate during a high-frequency measurement should be minimised in order to maximise the measurement accuracy. The sampling rate should synchronously and instantaneously conform to the frequency of the high-frequency output signal. There are therefore requirements with respect to frequency variation and frequency agility.

In addition, there is a need for phase-shift control of the high-frequency output power. Furthermore, there is a requirement to make it be possible to process and provide clock signals.

SUMMARY

The present invention features an apparatus for generating a plurality of clock signals or high-frequency signals. The apparatus includes a reference frequency generator that is connected to an oscillator and generates, at the output thereof, a reference signal having a reference frequency fx. The apparatus also includes at least one signal processor, for example a Direct Digital Synthesizer (DDS), which is connected to the reference signal generator via a first signal line and to which the reference signal having the reference frequency fx is supplied. The signal processor is configured to generate an output signal having a frequency less than fx.

In some implementations, a plurality of signal processors are provided that are configured to generate an output signal having a frequency less than fx. The output signals generated by the signal processors can have different frequencies. The output signals, i.e. the clock signals and high-frequency signals, are freely scalable and satisfy high requirements with respect to frequency stability and phase stability.

The oscillator can be an oscillator that generates a high frequency, for example a frequency greater than fx, and low jitter. If the reference frequency is derived from an oscillator having a higher frequency, the jitter of the reference signal decreases practically proportionally to the jitter of the oscillator signal. In some examples, the oscillator signal has a frequency that is greater than the reference signal by a factor of at least 3 to 5. For example, an oscillator may be used that outputs an oscillator signal having a frequency of 1 GHz. Using such an oscillator, reference signals can be derived that have frequencies of from approximately 50 MHz to 500 MHz.

The at least one signal processor may be configured to generate an output signal having a frequency n/m*fx (i.e., n/m times fx), where n, m∈N (i.e., n, m are natural numbers) and for example, m is greater than n. As a result of a reference signal with a reference frequency fx being generated, all other signals can be derived from said reference frequency by a multiple of n/m. In some implementations, to generate the various output signals, Direct Digital Synthesis (DDS) components are used of which the amplitude, frequency and phase during operation can be set digitally. In some instances, frequency changes to the reference frequency are instantaneously noticeable according to the set frequency ratio n/m at the output of the signal processors. From said signal, a high-frequency power signal having a corresponding amplitude, frequency and phase can be generated by using power amplifiers. Here, a specific configuration can be selected for each signal processor, which configuration can differ, for example, in terms of the selection of the values for n and m and thus the generated frequency.

In some implementations, the reference frequency generator is configured to generate a synchronization signal, for example, with a frequency fx/k (i.e., fx divided by k), where k∈N (i.e., k is a natural number), the reference frequency generator being connected to the at least one signal processor via a second signal line. As mentioned above, in some implementations, a plurality of signal processors are provided, to each of which the synchronization signal is supplied. By using a synchronization signal of this kind, all signals derived from the reference signal can be phase-locked to the reference frequency.

The signal lines can be of a defined length with respect to one another in order to balance signal propagation times. The lengths of the signal lines can therefore be matched to one another such that the signal propagation times are the same on the signal lines.

The at least one signal processor may be digitally settable by a configuration word (e.g. a set of configuration settings), the configuration word determining the frequency, the phase and/or the amplitude, of the output signal in relation to the reference signal. Using cyclic specification of the configuration word, amplitudes and phases of the output signals can be adjusted dynamically.

In some implementations, an external clock signal is supplied to the reference frequency generator, the reference frequency generator being configured to determine the frequency of the external clock signal and to convert said frequency to the reference frequency. With the help of the reference frequency generator, the jitter of the external clock signal can therefore be eliminated by the reference signal being generated having the same frequency as the external clock signal. In this way, the reference signal can also have a lower jitter. In addition, external clock signals of a higher or a lower frequency can be converted in a relative manner, i.e. a reference signal can be generated which has a different frequency to that of the external signal, but which follows a frequency change of the external signal.

In some implementations, a first signal processor is connected with its signal output to a phase comparator, to which the external clock signal is also supplied. In some examples, the output of the phase comparator is connected to the first signal processor. In this way, a reference phase can be generated by a signal processor. The reference phase can be adjusted to the input signal, i.e. the external clock signal, by using the phase comparator. A phase difference between the external clock signal and the output signal from the signal processor can be corrected, for example, by variation in the phase value in the configuration word. In some implementations, during the phase-shift control, the phase of the output signal is systematically shifted towards the phase of the reference signal such that the phase difference between the output signal and the external clock signal remains constant.

The output signal from the first signal processor can be used as a reference phase. Such a reference phase can be used for phase-shift control of the high-frequency power signal even in the absence of an external clock signal or during operation at an operating frequency that differs from the external clock signal, for example, to correct power-dependent phase changes to the power generator. Therefore, a power generator can also be operated having a frequency offset with respect to the external signal, and although no constant phase relationship can be established between these two signals, the phase of the high-frequency power signal can nevertheless be controlled to said internal reference phase.

In some implementations, the output of the first signal processor is connected to a first change-over switch, to which the external clock signal is also supplied. Using the change-over switch, either the external clock signal can be directly supplied to a clock output of the apparatus, or the output signal of the first signal processor can be made available externally by being supplied to the clock output.

In some implementations, a power generator is provided that includes at least one second signal processor, the output of the at least one second signal processor being connected to a power amplifier configured to generate a high-frequency power signal from the output signal of the signal processor.

In some implementations, a digital measurement device is provided that is connected to a sensor at the output of the power generator. Thus, the high-frequency (HF) power generated by the power generator, or a high-frequency signal (HF signal) related thereto, e.g. a high-frequency power signal, can be recorded. In some examples, the power generator includes a plurality of second signal processors, each of which connected to a power amplifier, the amounts of power at the outputs of the power amplifiers being combined to form a HF output signal.

In some implementations, the output of an additional signal processor is connected to a clock input of the measurement device, to supply a sampling frequency to the measurement device. The signal generation for the sampling and the high-frequency power is thus distributed to various, and in some examples identical, signal processors that are configured by different configuration words relating to their task. The jitter between the high-frequency power and a sampling rate of an analogue-to-digital converter used in the HF measurement can thereby be minimized. The measurement accuracy can be improved, by the sampling rate of the analogue-to-digital converter synchronously following the frequency of the high-frequency power signal.

In some implementations, the measurement device is connected to a change-over switch, to which the external clock signal and the output signal from the first signal processor are supplied. Said change-over switch makes it possible to use both the external clock signal and the signal having the reference phase for a phase measurement.

In some implementations, the measurement device includes an analogue-to-digital converter, to which the sampling frequency is supplied and which is connected to the sensor. Using the analogue-to-digital converter, the high-frequency power signal can thus be sampled at the sampling frequency. The measurement device may include a signal-processing unit, for example an FPGA, to which the sampling signal, the output signal from the change-over switch and a signal from the analogue-to-digital converter are supplied and which is configured to output a measurement result. In some examples, by using the reference phase output by the change-over switch, the phase position of the high-frequency power signal can be determined.

The scope of the invention also covers a method for generating a plurality of clock signals or high-frequency signals, in which a reference signal is generated and a high-frequency power signal is generated on the basis of the reference signal, the frequency of the high-frequency power signal being lower than the frequency fx of the reference signal. All generated signals are therefore dependent on the reference frequency fx and are therefore interrelated.

From the reference signal, a reference phase signal may be generated that can be used during a measurement of the high-frequency power signal. Thus, the phase of the high-frequency power signal can be determined.

From the reference signal, a sampling frequency may be generated that can be used during the measurement of the high-frequency power signal. The sampling frequency can thus be generated independently of a high-frequency signal from a power generator. However, the two signals are generated on the basis of the reference signal.

A synchronization signal, having a frequency of, for example, fx/k, where k is a natural number, such as fx/4, can be generated that is supplied to a plurality of signal processors, which generate an output signal on the basis of the reference frequency. Thus, all generated signals can be phase-locked to the reference frequency.

The apparatus according to some embodiments and the method according to some implementations of this disclosure therefore make it possible to monitor an external clock signal with respect to one or more allowed frequency ranges. The external clock signal can be freed of jitter. Furthermore, a power generator can be operated at an external clock signal that is a multiple of n/m of the high-frequency power signal, where n, m are natural numbers.

For the power generator, a low-jitter high-frequency power signal can be generated that is subsequently amplified by power amplifiers. A frequency offset of the high-frequency power with respect to an external clock signal can be set.

The jitter between the high-frequency power signal and a sampling rate of an analogue-to-digital converter can be minimized. The sampling rate of the analogue-to-digital converter can synchronously and instantaneously follow the frequency of the high-frequency power signal.

Furthermore, a phase measurement between the high-frequency power signal and the external clock signal is possible. Furthermore, phase shifting is possible, for example, if the external clock signal has an identical frequency to the generator frequency.

It is also possible to control the phase of the high-frequency power as desired.

Furthermore, it is possible to provide an output clock signal in synchrony with the high-frequency power. The external clock signal can be looped through the apparatus at a fixed phase relationship in a manner free of jitter. It is also possible to connect a plurality of high-frequency power generators in series in order to superpose the output signals thereof in-phase.

Further features and advantages of the invention can be found in the following detailed description of an embodiment of the invention, with reference to the FIGURE of the drawings, and in the claims. The features shown therein are not to be understood as being necessarily to scale. The various features may each be implemented in isolation or together in any desired combination in variants of the invention.

The schematic drawings show an embodiment of the invention, and the following description explains said embodiment in detail.

DESCRIPTION OF DRAWINGS

FIG. 1 is a perspective view of an apparatus for generating a plurality of clock signals or high-frequency signals, according to an implementation of the present disclosure.

DETAILED DESCRIPTION

FIG. 1 illustrates an apparatus 1, which includes a reference frequency generator 2 that is connected to an oscillator 3. Furthermore, the reference frequency generator 2 is connected to an external clock signal connection 4. The reference frequency generator 2 is configured to generate, from the signal of the oscillator 3 and/or the external clock signal, a reference signal at the output 5. The reference signal has a frequency fx. In addition, the reference frequency generator 2 is configured to generate, at the output 6, a synchronization signal. The synchronization signal can include a frequency fx/4. The oscillator 3 is designed to generate a signal with a high frequency and low jitter. With the help of a determiner device 7, which can be arranged inside or outside the reference frequency generator 2, the frequency of the external clock signal received via the connection 4 can be determined. In addition, the jitter of the external clock signal can be eliminated.

The output 5 of the reference frequency generator 2 is connected to a first signal processor 10, two second signal processors 11, 12 and one additional signal processor 14. The connection is established by length-controlled signal lines 15. Likewise, the output 6 is connected to the signal processors 10 to 14 via length-controlled signal lines 16. The signal processors 10 to 14 can be formed as Direct Digital Synthesizer (DDS). In some examples, the signal processing components 10 to 14 are identical. The signal processors 10 to 14 each generate, at their outputs, a clock signal or high-frequency signal that is related to the reference frequency fx, for example, related such that it has a frequency that fulfils the condition of n/m*fx, where m is greater than n, and m, n are natural numbers.

The output signals from the signal processors 10 to 14 follow frequency changes of the reference signal or the reference frequency fx in a relative manner, and the amplitude and phase of said output signals can be set as desired by a configuration word (e.g. configuration settings).

The first signal processor 10 is used to generate, from the frequency fx, an output signal having a frequency and phase defined by a software. Here, a phase comparator 17 is provided, to which the external clock signal is supplied via the input 4 and to which the output from the signal processor 10 is supplied. The phase difference is corrected by variation in the phase value according to the configuration word of the signal processor 10. Thus, the controlled output signal from the first signal processor 10 can be used in the apparatus 1 as a reference phase, and thus allows phase-shift control even in the absence of an external clock signal or during operation at a frequency of the high-frequency power signal that differs from the external clock signal. Said output signal is thus a reference phase signal.

The second signal processors 11, 12 generate a high-frequency signal that is supplied to a power amplifier 18, 19, respectively. The signal processors 11, 12 and the power amplifiers 18, 19 are part of a power generator 20 that outputs, at the output 21 thereof, a high-frequency power signal. Said high-frequency power signal can be made up of the output signals from the power amplifiers 18, 19; it is also possible to consider the output signals from the signal processors 11 and 12 to be high-frequency power signals. The power generator 20 can be operated in a pulsed mode, i.e. pause times (pulse pauses) can be provided in which no high-frequency power signal is output. In some implementations, a reference phase signal is generated that is always available, even during a pulse pause. If the signal from the signal processors 11 or 12 were used for the phase-shift control, the phase reference would disappear in pulse pauses on account of the amplitude modulation. In this case, control would always have to start again. By a reference phase signal being used, this control remains available even without the high-frequency power signal.

The third signal processor 14 generates, as an output signal, a sampling frequency for a synchronous digital measurement that is supplied to a measurement device 22 at a clock input 23. The frequency can be adapted to the measurement requirements by variation in the configuration word of the third signal processor 14, the sampling in a ratio n/m still taking place synchronously. The sampling signal is supplied to an analogue-to-digital converter 24 and to a signal-processing unit 25, e.g. an FPGA. The analogue-to-digital converter 24 is connected to a sensor 26 that records the high-frequency power signal that is output at the output 21. The signal-processing unit 25 outputs a measurement result at the output 30.

FIG. 1 also shows two change-over switches 27, 28, the change-over switch 27 being used either to supply the external clock signal directly to a clock output 29 or to make the reference phase signal at the output of the signal processor 10, externally available. The other change-over switch 28 makes it possible to use either the external clock signal and the signal having the reference phase for a phase measurement in the measurement device 22. The change-over switches 27, 28 can be programmable and can be set by software. The selection of the switch position is dependent on customer requirements and operating modes.

What is claimed is:

1. An apparatus for generating a plurality of clock signals or high-frequency signals, the apparatus comprising:
   a reference signal generator that is connected to an oscillator and that generates a reference signal having a reference frequency; and
   at least one signal processor connected to the reference signal generator via a first signal line and to which the reference signal is supplied,
   wherein the signal processor is configured to generate an output signal having a frequency less than the reference frequency,
   wherein the reference signal generator is configured to generate a synchronization signal, and connected to the at least one signal processor via a second signal line.

2. The apparatus of claim 1, wherein the at least one signal processor is configured to generate the output signal having a frequency that is n/m times the reference frequency, where n and m are natural numbers, and m is greater than n.

3. The apparatus of claim 1, wherein the synchronization signal has a frequency that is the reference frequency divided by k, where k is a natural number.

4. The apparatus of claim 1, wherein lengths of the first and the second signal lines are matched to one another such that signal propagation times are the same on the first and the second signal lines.

5. The apparatus of claim 1, wherein the at least one signal processor can be configured by a configuration word that determines at least one of a frequency, a phase and an amplitude, of the output signal in relation to the reference signal.

6. The apparatus of claim 1, wherein the at least one signal processor is a Direct Digital Synthesizer (DDS).

7. An apparatus for generating a plurality of clock signals or high-frequency signals, the apparatus comprising:
    a reference signal generator that is connected to an oscillator and that generates a reference signal having a reference frequency; and
    at least one signal processor connected to the reference signal generator via a first signal line and to which the reference signal is supplied,
    wherein the signal processor is configured to generate an output signal having a frequency less than the reference frequency, and
    wherein an external clock signal is supplied to the reference signal generator, the reference signal generator being configured to determine a frequency of the external clock signal and to convert the frequency of the external clock signal to the reference frequency.

8. The apparatus of claim 7, comprising a first signal processor that has a signal output connected to a phase comparator, the phase comparator being supplied by the external clock signal and having an output that is connected to the first signal processor.

9. The apparatus of claim 8, wherein the signal output of the first signal processor is connected to a first change-over switch supplied by the external clock signal.

10. An apparatus for generating a plurality of clock signals or high-frequency signals, the apparatus comprising:
    a reference signal generator that is connected to an oscillator and that generates a reference signal having a reference frequency;
    at least one signal processor connected to the reference signal generator via a first signal line and to which the reference signal is supplied, wherein the signal processor is configured to generate an output signal having a frequency less than the reference frequency; and
    a power generator that comprises at least one second signal processor, an output of the at least one second signal processor being connected to a power amplifier to generate a high-frequency power signal from the output of the at least one second signal processor.

11. The apparatus of claim 10, further comprising a digital measurement device that is connected to a sensor at an output of the power generator.

12. The apparatus of claim 11, further comprising an additional signal processor with an additional output, the additional output is connected to a clock input of the digital measurement device in order to supply a sampling frequency to the digital measurement device.

13. The apparatus of claim 12, wherein the digital measurement device comprises an Analog-to-Digital (A/D) converter that is supplied by the sampling frequency, and is connected to the sensor.

14. The apparatus of claim 11, wherein the digital measurement device is connected to a change-over switch, the change-over switch being supplied by an external clock signal and a signal output of a first signal processor,
    wherein the external clock signal is supplied to the reference signal generator, the reference signal generator being configured to determine a frequency of the external clock signal and convert the frequency of the external clock signal to the reference frequency, and
    wherein the signal output is connected to a phase comparator, the phase comparator being supplied by the external clock signal and having an output that is connected to the first signal processor.

15. The apparatus of claim 14, wherein the digital measurement device comprises a signal-processing unit that is supplied by a sampling signal and an output of the change-over switch and a signal from an Analog-to-Digital (A/D) converter, the signal processing unit is configured to output a measurement result.

16. A method for generating a plurality of clock signals or high-frequency signals, the method comprising:
    generating a reference signal having a reference frequency;
    generating a high-frequency power signal based on the reference signal, the high-frequency power signal having a frequency lower than the reference frequency of the reference signal; and
    generating a reference phase signal from the reference signal, the reference phase signal being used during a measurement of the high-frequency power signal.

17. The method of claim 16, further comprising generating an output signal with a frequency that is n/m times the reference frequency, wherein n and m are natural numbers, and m is greater than n.

18. A method for generating a plurality of clock signals or high-frequency signals, the method comprising:
    generating a reference signal having a reference frequency;
    generating a high-frequency power signal based on the reference signal, the high-frequency power signal having a frequency lower than the reference frequency of the reference signal; and
    generating a sampling frequency from the reference signal, the sampling frequency being used during a measurement of the high-frequency power signal.

19. A method for generating a plurality of clock signals or high-frequency signals, the method comprising:
    generating a reference signal having a reference frequency;
    generating a high-frequency power signal based on the reference signal, the high-frequency power signal having a frequency lower than the reference frequency of the reference signal; and
    generating a synchronization signal that is supplied to a plurality of signal processors that generate an output signal based on the reference frequency.

* * * * *